United States Patent
Konishi et al.

(10) Patent No.: US 10,243,067 B2
(45) Date of Patent: Mar. 26, 2019

(54) SEMICONDUCTOR DEVICE AND METHOD FOR MANUFACTURING THE SAME

(71) Applicant: Mitsubishi Electric Corporation, Tokyo (JP)

(72) Inventors: Kazuya Konishi, Tokyo (JP); Yusuke Fukada, Tokyo (JP); Atsushi Narazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 31 days.

(21) Appl. No.: 14/567,354

(22) Filed: Dec. 11, 2014

(65) Prior Publication Data
US 2015/0270378 A1    Sep. 24, 2015

(30) Foreign Application Priority Data
Mar. 19, 2014    (JP) .................................. 2014-055805

(51) Int. Cl.
*H01L 29/739*    (2006.01)
*H01L 29/06*    (2006.01)
(Continued)

(52) U.S. Cl.
CPC .... *H01L 29/7397* (2013.01); *H01L 21/26533* (2013.01); *H01L 21/761* (2013.01);
(Continued)

(58) Field of Classification Search
CPC ........... H01L 29/0649; H01L 21/76224; H01L 21/26533; H01L 29/7397; H01L 21/761;
(Continued)

(56) References Cited

U.S. PATENT DOCUMENTS 6,617,641 B2    9/2003    Nakagawa et al.
6,693,310 B1 *  2/2004    Takahashi ........... H01L 29/0692
                                                                257/135
(Continued)

FOREIGN PATENT DOCUMENTS

JP    H04-067667 A    3/1992
JP    H07-321316 A    12/1995
(Continued)

OTHER PUBLICATIONS

The First Office Action issued by the Korean Patent Office on Jun. 17, 2016, which corresponds to Korean Patent Application No. 10-2015-0032947 and is related to U.S. Appl. No. 14/567,354; with English language partial translation.

(Continued)

*Primary Examiner* — Jarrett J Stark
*Assistant Examiner* — Charles N Ausar-El
(74) *Attorney, Agent, or Firm* — Studebaker & Brackett PC

(57) ABSTRACT

A semiconductor device includes a first semiconductor layer on one main surface of a semiconductor substrate; a plurality of trench gates in the first semiconductor layer extending to reach the inside of the semiconductor substrate; a second semiconductor layer selectively provided in an upper portion of the first semiconductor layer between the trench gates; an isolation layer in contact with a side surface of the second semiconductor layer and extends in the first semiconductor; and a third semiconductor layer in the upper portion of the first semiconductor layer between the trench gates and has at least one side surface in contact with the trench gate. The isolation layer is between and separates the second semiconductor layer and the third semiconductor layer from each other and is formed to extend to the same depth as, or to a position deeper than the second semiconductor layer.

14 Claims, 13 Drawing Sheets

(51) Int. Cl.

| | |
|---|---|
| *H01L 29/10* | (2006.01) |
| *H01L 29/423* | (2006.01) |
| *H01L 29/49* | (2006.01) |
| *H01L 29/66* | (2006.01) |
| *H01L 21/762* | (2006.01) |
| *H01L 21/761* | (2006.01) |
| *H01L 21/265* | (2006.01) |

(52) U.S. Cl.
CPC .... *H01L 21/76224* (2013.01); *H01L 29/0653* (2013.01); *H01L 29/0696* (2013.01); *H01L 29/1095* (2013.01); *H01L 29/4236* (2013.01); *H01L 29/4916* (2013.01); *H01L 29/66348* (2013.01)

(58) Field of Classification Search
CPC ............ H01L 29/0653; H01L 29/0696; H01L 29/1095; H01L 29/4236; H01L 29/4916; H01L 29/66348
USPC .......................................................... 257/139
See application file for complete search history.

(56) References Cited

U.S. PATENT DOCUMENTS

| | | | | |
|---|---|---|---|---|
| 6,956,266 | B1* | 10/2005 | Voldman | H01L 21/76237 257/347 |
| 7,582,519 | B2* | 9/2009 | Kocon | H01L 29/404 257/328 |
| 7,701,033 | B2* | 4/2010 | Williams | H01L 21/26513 257/506 |
| 8,334,541 | B2 | 12/2012 | Miyahara et al. | |
| 8,872,266 | B1* | 10/2014 | Hsu | H01L 21/76237 257/270 |
| 9,299,818 | B2* | 3/2016 | Aono | H01L 29/7393 |
| 9,343,526 | B2* | 5/2016 | Cheng | H01L 29/0611 |
| 9,601,564 | B2* | 3/2017 | Cheng | H01L 29/0638 |
| 10,096,474 | B2 | 10/2018 | Mukherjee | H01L 21/02694 |
| 2002/0100934 | A1 | 8/2002 | Nakagawa et al. | |
| 2003/0042537 | A1 | 3/2003 | Nakamura et al. | |
| 2005/0280029 | A1 | 12/2005 | Nakamura et al. | |
| 2006/0214221 | A1* | 9/2006 | Challa | H01L 21/3065 257/328 |
| 2007/0102773 | A1* | 5/2007 | Hisatomi | H01L 29/063 257/401 |
| 2008/0164516 | A1* | 7/2008 | Darwish | H01L 29/0649 257/329 |
| 2010/0032767 | A1* | 2/2010 | Chapman | H01L 21/743 257/372 |
| 2010/0155895 | A1* | 6/2010 | Tsai | H01L 29/7393 257/578 |
| 2010/0213505 | A1* | 8/2010 | Hirler | H01L 27/0727 257/139 |
| 2010/0237412 | A1 | 9/2010 | Shrivastava et al. | |
| 2012/0012860 | A1 | 1/2012 | Miyahara et al. | |
| 2014/0054644 | A1* | 2/2014 | Hikasa | H01L 29/7395 257/139 |
| 2015/0255586 | A1* | 9/2015 | Naijo | H01L 29/66348 257/133 |
| 2016/0035869 | A1* | 2/2016 | Matsudai | H01L 29/7395 257/140 |
| 2016/0099308 | A1* | 4/2016 | Lui | H01L 29/0638 257/331 |
| 2016/0126147 | A1* | 5/2016 | Chapman | H01L 21/743 438/219 |

FOREIGN PATENT DOCUMENTS

| | | |
|---|---|---|
| JP | 2001-308328 A | 11/2001 |
| JP | 2002-305305 A | 10/2002 |
| JP | 2008-198816 A | 8/2008 |
| JP | 2008-251620 A | 10/2008 |
| JP | 2009-043966 A | 2/2009 |
| JP | 2012-023291 A | 2/2012 |
| JP | 2012-059873 A | 3/2012 |
| JP | 2012-191053 A | 10/2012 |
| JP | 2013-069871 A | 4/2013 |
| KR | 2002-0086655 A | 11/2002 |
| KR | 2007-0032627 A | 3/2007 |
| WO | 2005/065385 A2 | 7/2005 |

OTHER PUBLICATIONS

An Office Action issued by the Korean Patent Office dated Dec. 28, 2016, which corresponds to Korean Patent Application No. 10-2015-0032947 and is related to U.S. Appl. No. 14/567,354; with English language translation.

An Office Action issued by the German Patent Office dated Apr. 9, 2018, which corresponds to German Patent Application No. 10 2015 204 636.2 and is related to U.S. Appl. No. 14/567,354; with English translation.

An Addendum to Pending Office Action issued by the German Patent Office on May 8, 2018, which corresponds to German Patent Application No. 10 2015 204 636.2 and is related to U.S. Appl. No. 14/567,354; with English translation.

An Office Action; "Notification of Reasons for Refusal" issued by the Japanese Patent Office on Feb. 28, 2017 which corresponds to Japanese Patent Application No. 2014-055805 and is related to U.S. Appl. No. 14/567,354; with English language translation.

* cited by examiner

F I G. 9
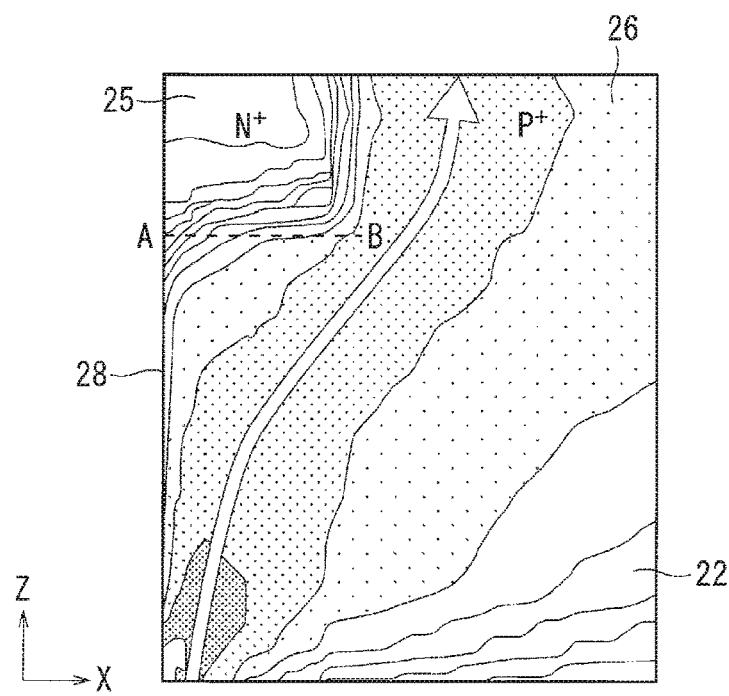
F I G. 10
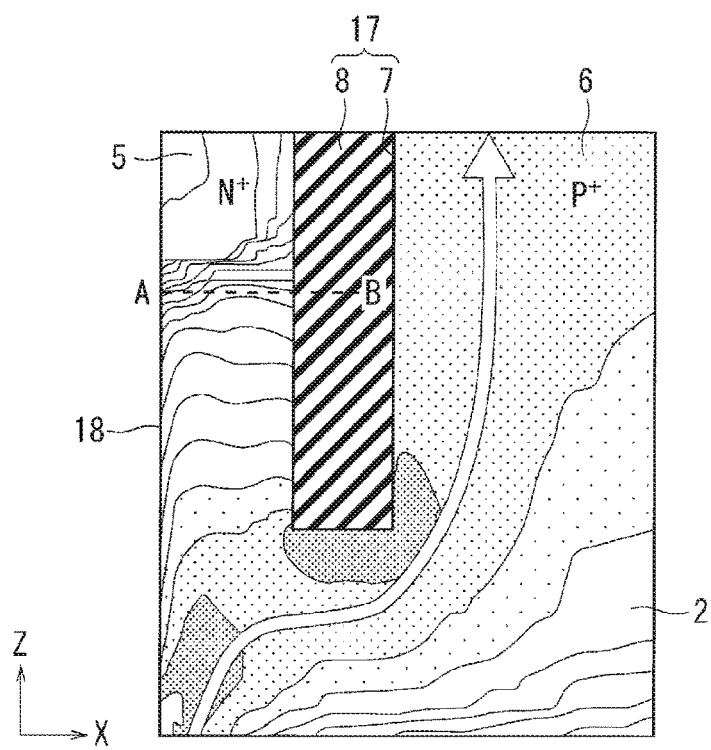

FIG. 19  (Replacement Sheet)

SEMICONDUCTOR DEVICE AND METHOD FOR MANUFACTURING THE SAME

BACKGROUND OF THE INVENTION

Field of the Invention

The present invention relates to a semiconductor device and more particularly to a technology to improve performance of a switching device.

Description of the Background Art

In recent times, intelligent power modules (IPMs) are adopted to achieve energy-conservation, miniaturization, and weight reduction of household electrical appliances. For switching devices in the IPMs, insulated gate bipolar transistors (IGBTs) are widely used.

The IGBTs are required to be devices having low on-resistance, low switching loss, and high durability.

A guarantee of use in high current density and of operation in 150° C. or more is required recently, thereby requiring the IGBTs having durability higher than the conventional ones.

Examples of modes in which a malfunction occurs in the device include a latch-up mode. The latch-up mode that damages the device is resulted from a latch-up state where the current keeps flowing. The latch-up state is an on-state of a parasitic thyristor. This is caused by a situation in which a voltage drop due to a hole current flowing through a P-type base layer exceeds a built-in voltage between an emitter layer having a relatively high concentration ($N^+$) of N-type impurities and the P-type base layer when the IGBT, for example, is shifted from an on-state where a main current flows to an off-state where no main current flows.

To increase a tolerance to the latch-up, the resistance of the base layer and the voltage drop upon the hole current flowing through the base layer need to be reduced. The built-in voltage decreases in high temperature operation, so that the latch-up mode easily occurs and the durability decreases.

To solve this problem, Japanese Patent Application Laid-Open No. 2001-308328 discloses the technology to reduce the resistance of the base layer by forming a diffusion layer having a relatively high concentration (P+) of P-type impurities deeper than the emitter layer in the IGBT having a trench gate and to prevent the parasitic thyristor from turning on by passing the hole built up in the device during turn-off to the emitter layer to secure high durability.

The configuration disclosed in Japanese Patent Application Laid-Open No. 2001-308328 forms the diffusion layer deeper than the emitter layer, the diffusion layer having a high concentration of the P-type impurities necessary for securing the durability. In this case, however, the diffusion layer gets close to a channel region near the trench gate. As a result, electrical characteristics of the semiconductor device are affected, and thus the electrical characteristics such as a threshold voltage vary greatly.

SUMMARY OF THE INVENTION

It is an object of the present invention to provide a semiconductor device that suppresses a variation in an electrical characteristic such as a threshold voltage and improves durability.

A semiconductor device according to the present invention includes: a first semiconductor layer of a second conductivity type disposed on one main surface of a semiconductor substrate of a first conductivity type; a plurality of trench gates penetrating the first semiconductor layer in a thickness direction to reach the inside of the semiconductor substrate; a second semiconductor layer of the second conductivity type selectively provided in an upper portion of the first semiconductor layer between the trench gates; an isolation layer that is in contact with a side surface of the second semiconductor layer and extends in the first semiconductor layer in the thickness direction; a third semiconductor layer of the first conductivity type that is provided in the upper portion of the first semiconductor layer between the trench gates and has at least one side surface in contact with the trench gate; a first main electrode disposed on the first semiconductor layer so as to come into contact with the second semiconductor layer and the third semiconductor layer; and a second main electrode provided on the other main surface side opposite to the one main surface of the semiconductor substrate. The isolation layer is provided between the second semiconductor layer and the third semiconductor layer to separate the second and third semiconductor layers from each other and is formed to extend to the same depth as that of the second semiconductor layer or to a position deeper than that of the second semiconductor layer.

In the semiconductor device, the isolation layer suppresses a diffusion in a horizontal direction of impurities of a second conductivity type of the second semiconductor layer. Even if the distance between the trench gate and the second semiconductor layer is short, the distance between the trench gates can be shorten without increasing the threshold voltage. The suppression of the latch-up can also increase the durability.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a diagram illustrating a distribution of an absolute value of a hole current density during turn-off in a case where a shallow $P^+$ diffusion layer is provided;

FIG. 10 is a diagram illustrating a distribution of an absolute value of a hole current density during turn-off in a case where a deep $P^+$ diffusion layer is provided;

DESCRIPTION OF THE PREFERRED EMBODIMENTS

<Introduction>

Prior to descriptions of the preferred embodiments, further description is given here of the configuration that forms a diffusion layer deeper than an emitter layer in an IGBT including a trench gate, the diffusion layer having a relatively high concentration of P-type impurities.

Figure 19:
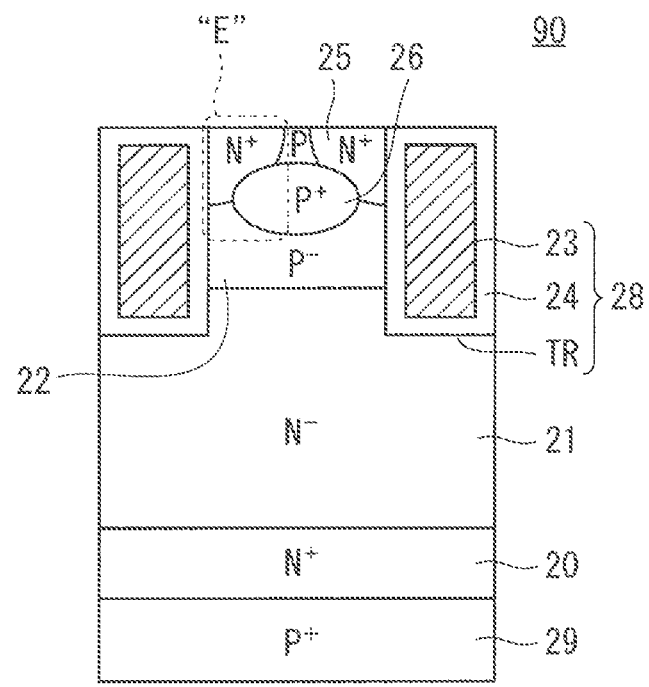
FIG. 19 is a cross-sectional view showing a configuration of a conventional IGBT including a trench gate.

FIG. 19 is a cross-sectional view showing a configuration of an IGBT 90 including a trench gate. In the IGBT 90 as shown in FIG. 19, a buffer layer 20 having a relatively high concentration ($N^+$) of N-type impurities and an epitaxial layer 21 having a relatively low concentration ($N^-$) of the N-type impurities are formed in the stated order on a semiconductor substrate 29 having a relatively high concentration ($P^+$) of the P-type impurities, and a body region 22 having a relatively low concentration ($P^-$) of the P-type impurities is formed on the epitaxial layer 21.

A plurality of trenches TR are provided to penetrate the body region 22 in a thickness direction to reach the inside of the epitaxial layer 21. An inner surface of each trench TR is covered with a gate insulating film 24, and a gate electrode 23 is provided to be surrounded by the gate insulating film 24. A trench gate 28 is formed of the gate insulating film 24 and the gate electrode 23.

A plurality of emitter layers 25 having the relatively high concentration ($N^+$) of the N-type impurities are selectively provided in an upper portion of the body region 22 between the trench gates 28. The region between the emitter layers 25 includes the P-type impurities, and a diffusion layer 26 having the relatively high concentration ($P^+$) of the P-type impurities is formed to extend between the emitter layers 25 at the depth deeper than that of the emitter layers 25.

Figure 20:
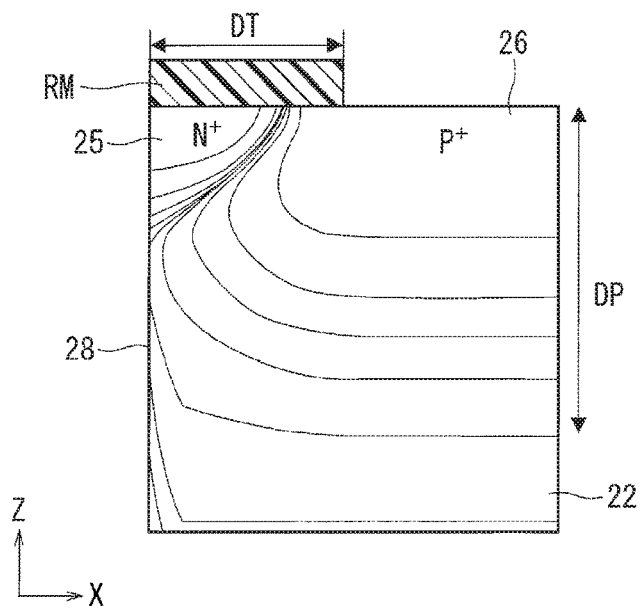
FIGS. 20 and 21 are cross-sectional views showing an impurity distribution of a region including an emitter layer of the conventional IGBT including the trench gate.

In the IGBT 90 having such configuration, a region "E" including one of the emitter layers 25 is shown as an example of an impurity distribution in FIG. 20.

FIG. 20 shows a concentration distribution in a case where the diffusion layer 26 is formed approximately twice as deep as the emitter layer 25. The P-impurities are distributed in the range shown by an arrow DP in the diagram. Hereinafter, this is referred to as the deep $P^+$ diffusion layer.

In this manner, the diffusion layer 26 is formed at the deep depth, thereby being close to a channel region formed in the body region 22 near the trench gate 28 as shown in FIG. 20.

Figure 21:
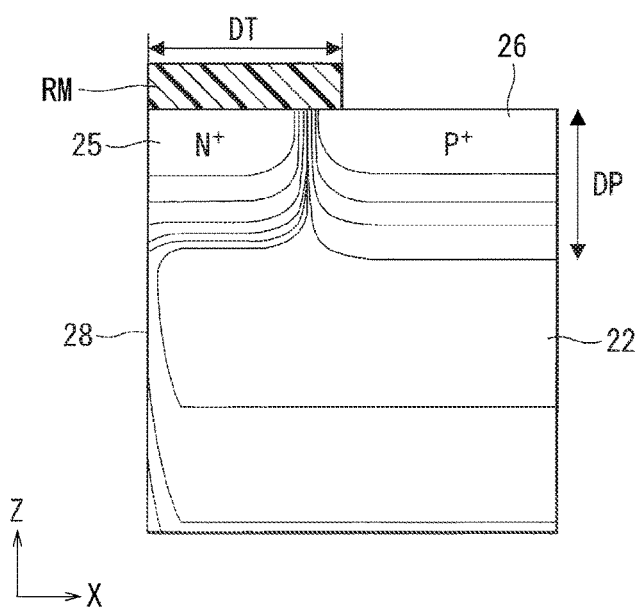

Moreover, FIG. 21 shows a concentration distribution in a case where the diffusion layer 26 is formed at approximately the same depth as that of the emitter layer 25. The P-type impurities are distributed in the range shown by an arrow DP in the diagram. FIGS. 20 and 21 show the impurity concentration by isoconcentration lines. Among the regions surrounded by the plurality of isoconcentration lines, the region closer to the outermost surface has the higher concentration.

In this manner, in a case where the diffusion layer 26 is shallow, the diffusion layer 26 does not get close to the trench gate 28 as shown in FIG. 21. Hereinafter, this is referred to as the shallow $P^+$ diffusion layer.

Figure 22:
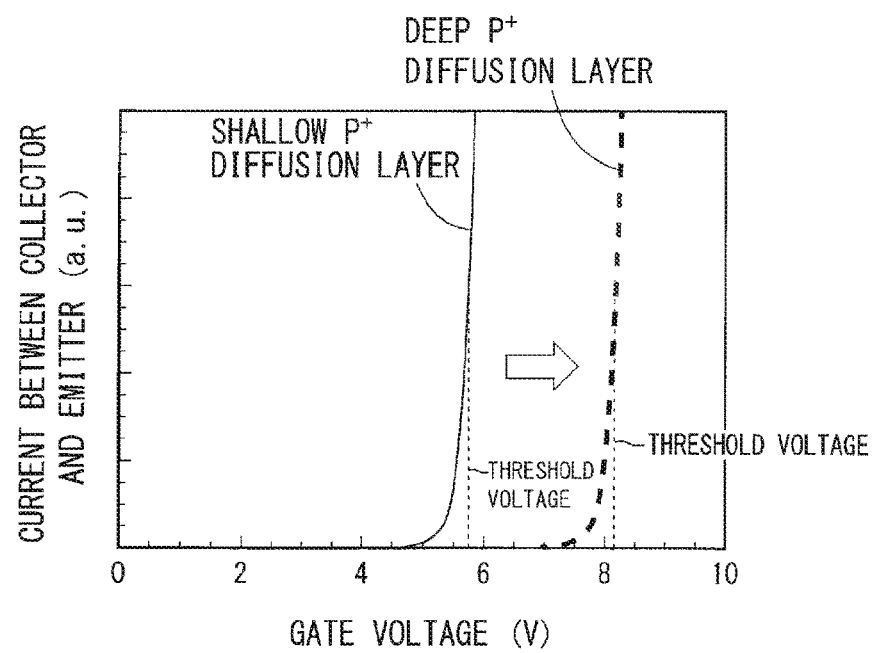
FIG. 22 is a diagram illustrating an electrical characteristic between a collector and an emitter upon application of a gate voltage.

FIG. 22 shows an electrical characteristic between a collector and an emitter upon application of a gate voltage in a case where the deep $P^+$ diffusion layer as shown in FIG. 20 is provided and a case where the shallow $P^+$ diffusion layer as shown in FIG. 21 is provided.

In FIG. 22, the horizontal axis represents a gate voltage (V) and the vertical axis represents a current between the collector and the emitter (a.u.). It is clear that the case where the deep $P^+$ diffusion layer is provided has a threshold voltage higher than that in the case where the shallow $P^+$ diffusion layer is provided.

The conceivable reason is that the diffusion layer 26 is close to the channel region to affect the channel region. To reduce the influence on the channel region, the diffusion layer 26 is needed to keep a predetermined distance from the trench gate 28.

Here, FIGS. 20 and 21 show the state where an implantation mask RM used for forming the diffusion layer 26 is disposed. A distance DT from the trench gate 28 to the diffusion layer 26 is defined as a length of the implantation mask RM from the trench gate 28.

Therefore, as the length of the implantation mask RM from the trench gate 28 increases, the distance DT from the trench gate 28 to the diffusion layer 26 can be increased. This, however, increases the distance between the trench gates, to thereby reduce the number of trench gates allowed to be formed per unit area. This efficiently reduces the channel width, so that the on-resistance increases.

Figure 23:
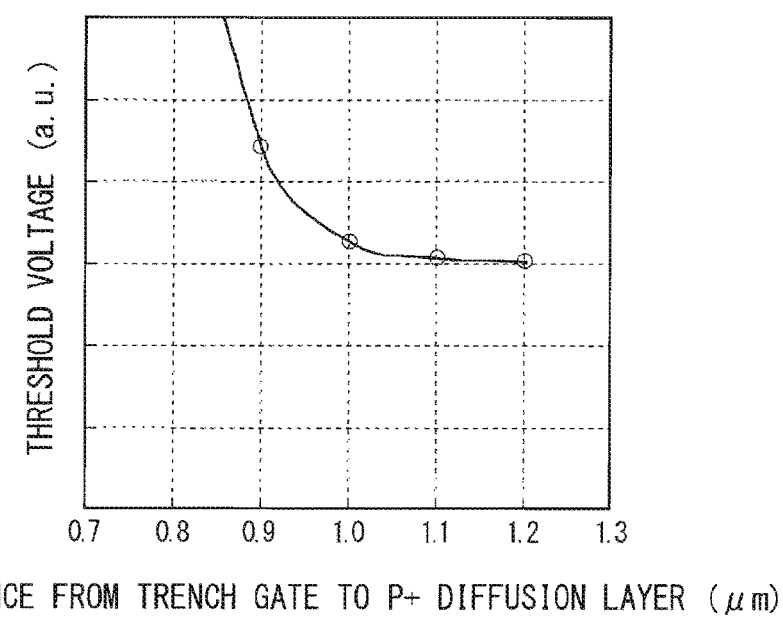
FIG. 23 is a diagram illustrating a dependence of a threshold voltage on a distance between a trench gate and a $P^+$ diffusion layer.

FIG. 23 is a diagram illustrating a dependence of a threshold voltage on a distance between the trench gate and the $P^+$ diffusion layer. In FIG. 23, the horizontal axis represents a distance from the trench gate to the $P^+$ diffusion layer (m) and the vertical axis represents the threshold voltage (a.u.).

As seen from FIG. 23, if the distance between the trench gate and the $P^+$ diffusion layer is short, the threshold voltage increases, resulting in the great range of variation associated by a change in the distance. In contrast, if the distance between the trench gate and the $P^+$ diffusion layer increases to be approximately 1.2 µm, the threshold voltage decreases, so that the range of variation associated by the change in the distance is decreased to be stable. The preferred embodiments according to the present invention will be described below on the basis of the descriptions above.

<First Preferred Embodiment>
<Configuration of Device>

Figure 1:
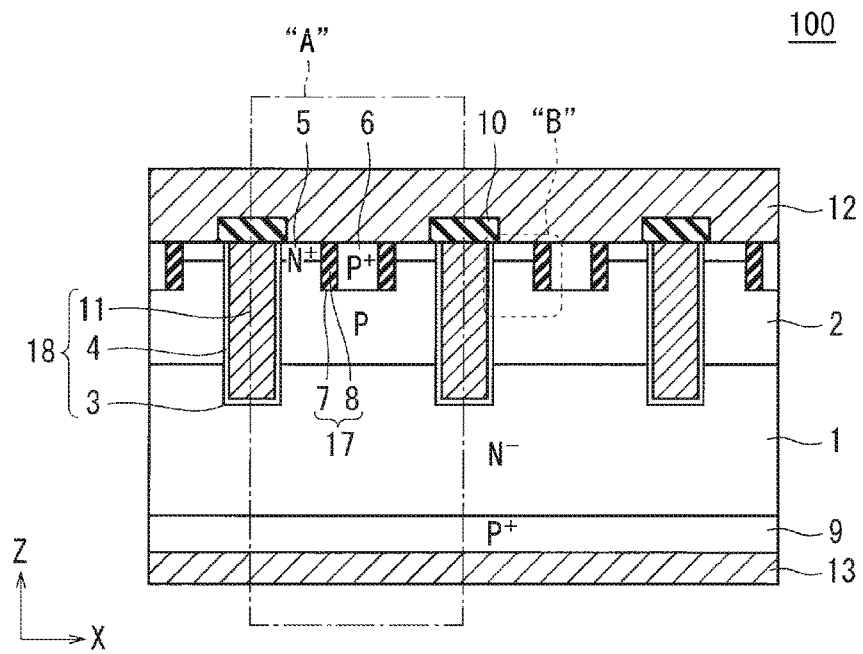
FIG. 1 is a cross-sectional view showing a configuration of an IGBT of a first preferred embodiment according to the present invention.

FIG. 1 is a cross-sectional view showing a configuration of an IGBT 100 of a first preferred embodiment according to the present invention. In the IGBT 100 shown in FIG. 1, a base layer 2 having P-type impurities is formed on one main surface of a semiconductor substrate 1 having a relatively low concentration (N) of N-type impurities, a collector layer 9 having a relatively high concentration ($P^+$) of the P-type impurities is formed on the other main surface of the semiconductor substrate 1 opposite to the surface having the base layer 2 laminated thereon, and a collector electrode 13 is formed so as to cover the whole surface of the collector layer 9. In addition, the semiconductor substrate 1 may be a silicon substrate or may also be a semiconductor substrate having a wide band gap which is wider than a silicon semiconductor of a silicon carbide substrate or the like.

A plurality of trenches 3 are provided to penetrate the base layer 2 in a thickness direction to reach the inside of the semiconductor substrate 1. An inner surface of each trench 3 is covered with a gate oxide film 4, and gate electrodes 11 are provided to be surrounded by the gate oxide films 4. Trench gates 18 are formed of the trenches 3, the gate oxide films 4, and the gate electrodes 11.

Diffusion layers 6 having the relatively high concentration ($P^+$) of the P-type impurities are selectively provided in an upper portion of the base layer 2 between the trench gates 18. Trenches 7 extending in the base layer 2 in the thickness direction are provided so as to come into contact with each of two side surfaces facing the diffusion layers 6. The trenches 7 are filled with insulating layers 8 to form trench isolation layers 17.

Two emitter layers 5 having the relatively high concentration ($N^+$) of the N-type impurities are selectively provided in the upper portion of the base layer 2 between the trench gates 18. One side surface of each emitter layer 5 is formed to be in contact with the trench gate 18, and the other side surface opposite to the one side surface is in contact with the trench isolation layer 17.

The trench isolation layers 17 are formed at the same or slightly deeper depth than that of the diffusion layers 6, and the diffusion layers 6 are formed at the depth deeper than that of the emitter layers 5. For example, in a case where the emitter layer 5 has the depth of 0.5 µm, the diffusion layer 6 has the depth of approximately 1.0 µm and the trench isolation layer 17 has the depth of approximately 1.0 µm.

The upper portions of the plurality of trench gates 18 are each covered with an interlayer insulating film 10. The interlayer insulating films 10 are formed to extend to the upper portions of the emitter layers 5 near the portions of the trench gates 18.

An emitter electrode 12 is formed so as to cover the whole surface of the base layer 2 including the upper portions of the interlayer insulating films 10. FIG. 1 shows an alignment direction of the trench gates 18 as an X direction and a thickness direction of the semiconductor substrate 1 and the like as a Z direction.

Figure 2:
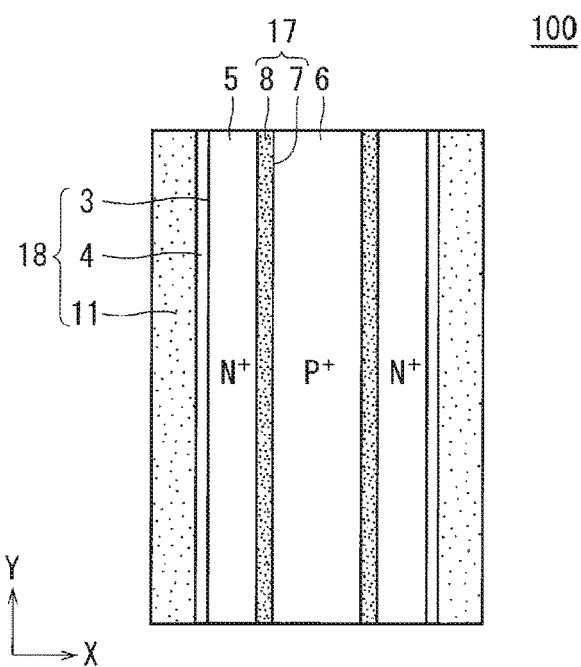
FIG. 2 is a partial plan view of one IGBT cell of the first preferred embodiment according to the present invention.

FIG. 2 is a partial plan view of one IGBT cell defined as a region "A" in FIG. 1. FIG. 2 omits the interlayer insulating films 10 and the emitter electrode 12 on the main surface of the base layer 2 for the sake of convenience. FIG. 2 shows the alignment direction of the trench gates 18 as the X direction and a direction orthogonal to the X direction as a Y direction.

As shown in FIG. 2, all of the diffusion layers 6, the trench isolation layers 17, the emitter layers 5, and the trench gates 18 have a stripe shape in plan view and extend in the Y direction.

<Manufacturing Method>

Figure 3:
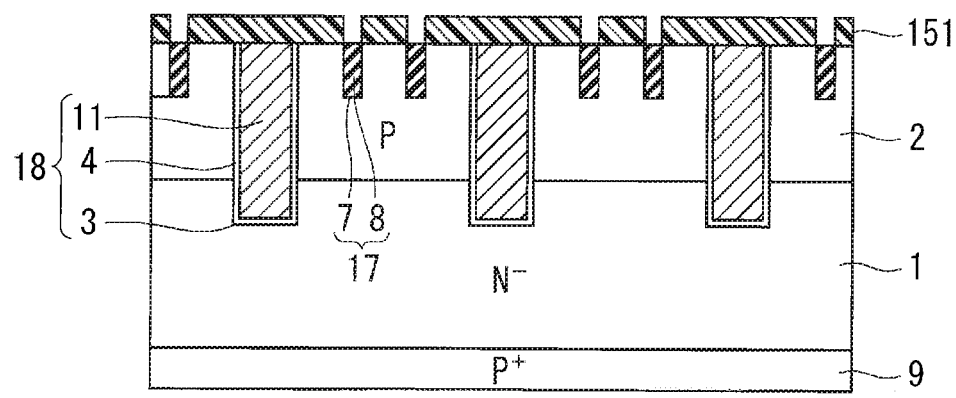
FIGS. 3 to 5 are cross-sectional views for describing a method for manufacturing the IGBT of the first preferred embodiment according to the present invention.

Next, a method for manufacturing the IGBT 100 will be described with reference to FIGS. 3 to 5. First, in a step shown in FIG. 3, the semiconductor substrate 1 having the relatively low concentration ($N^-$) of the N-type impurities is prepared, and a boron (B) is ion-implanted as the P-type impurity into the one main surface side of the semiconductor substrate 1 to form the base layer 2. The base layer 2 has the impurity concentration of $1 \times 10^{17}$ to $5 \times 10^{17}/cm^3$ and the depth of approximately 3.0 µm.

Moreover, B is ion-implanted as the P-type impurity into the other main surface side of the semiconductor substrate 1 to form the collector layer 9, the other main surface side being opposite to the side including the base layer 2 provided thereon. The collector layer 9 has the impurity concentration of $5 \times 10^{17}$ to $5 \times 10^{18}/cm^3$ and the depth of approximately 0.5 µm.

Subsequently, an etching forms the plurality of trenches 3 to penetrate the base layer 2 in the thickness direction to reach the inside of the semiconductor substrate 1. The trench 3 has the depth of approximately 3.5 µm and the width of approximately 1.0 µm.

Then, a chemical vapor deposition (CVD) method, for example, forms silicon oxide films so as to cover the inner surfaces of the trenches 3 to obtain the gate oxide films 4. The gate oxide film 4 has a thickness of approximately 0.1 µm.

Subsequently, the trenches 3 having the inner surfaces covered with the gate oxide films 4 are filled with a polysilicon having conductivity to form the gate electrodes 11. The polysilicon is formed by the CVD method, for example, so as to include the relatively high concentration of the impurities.

Next, a mask 151 having opening portions corresponding to the portions of the trenches 7 is patterned on the base layer 2, and the mask 151 as an etching mask etches the base layer 2 to form the trenches 7 having the depth of approximately 1.0 µm.

Subsequently, the CVD method, for example, fills the silicon oxide films inside the trenches 7 to form the insulating layers 8, to thereby obtain the trench isolation layers 17. In a state where the mask 151 is formed, the silicon oxide films are formed to be lifted off with the mask 151, whereby the excess silicon oxide films except for those in the trenches 7 may be removed.

Figure 4:
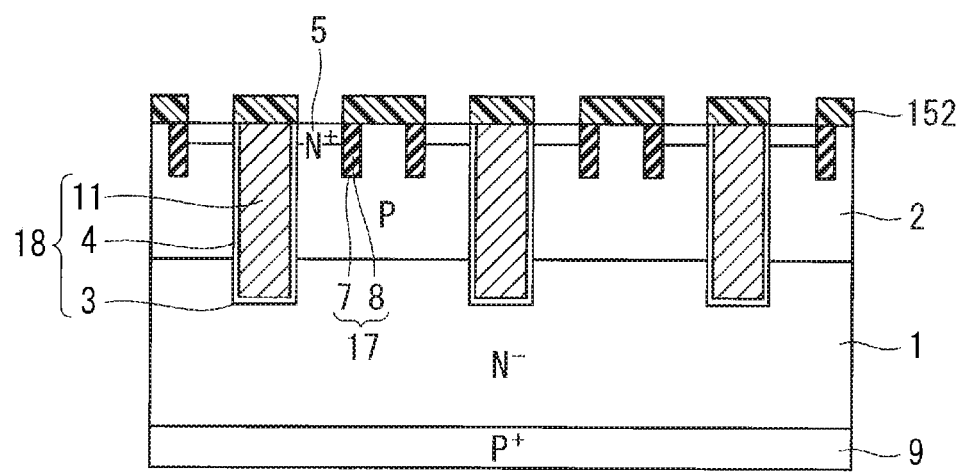

Next, in a step shown in FIG. 4, a mask 152 having opening portions corresponding to the portions of the emitter layers 5 is patterned on the base layer 2, the mask 152 is served as an ion-implantation mask, and an arsenic (As) or a phosphorus (P) is ion-implanted as the N-type impurity, to thereby form the emitter layers 5. The emitter layer 5 has the impurity concentration of $5 \times 10^{18}$ to $5 \times 10^{19}/cm^3$ and the depth of approximately 0.5 µm.

Figure 5:
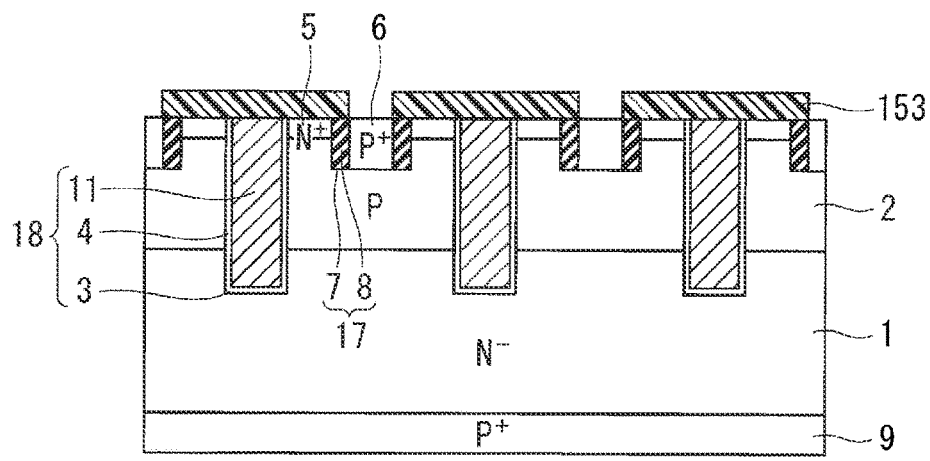

After removing the mask 152, in a step shown in FIG. 5, a mask 153 having opening portions corresponding to the portions of the diffusion layers 6 is patterned on the base layer 2, the mask 153 is served as an ion-implantation mask, and B is ion-implanted as the P-type impurity, to thereby form the diffusion layers 6. The diffusion layer 6 has the impurity concentration of $5 \times 10^{18}$ to $5 \times 10^{19}/cm^3$ and the depth of approximately 1.0 µm.

After removing the mask 153, the CVD method, for example, forms the silicon oxide films so as to cover the whole upper surface of the base layer 2, and the silicon oxide films are patterned to be left only the upper portions of the trench gates 18 and the upper portions of the emitter layers 5 near the portions of the trench gates 18, to thereby obtain the interlayer insulating films 10. The interlayer insulating film 10 has the thickness of approximately 1.0 µm.

Subsequently, an aluminum layer or an aluminum silicon layer is formed by a sputtering method, for example, so as to cover the whole surface of the base layer 2 including the upper portions of the interlayer insulating films 10 to serve as the emitter electrode 12. Moreover, the aluminum layer or the aluminum silicon layer is formed by the sputtering method, for example, so as to cover the whole surface of the collector layer 9 to serve as the collector electrode 13, to thereby obtain the IGBT 100 shown in FIG. 1.

As described above, the manufacturing method of the first preferred embodiment forms the trench isolation layers 17 in the step prior to the step of forming the diffusion layers 6, forms the trenches 7 having the width larger than a dimension of an alignment accuracy of the diffusion layers 6, and fills the trenches 7 with the insulating layers 8, to thereby obtain the trench isolation layers 17.

Thus, even if the misalignment of the mask 153 for forming the diffusion layers 6 occurs, the region where the diffusion layers 6 are misaligned is included in the trench isolation layers 17, whereby a variation in the threshold voltage caused by the misalignment of the diffusion layers 6 does not occur. In a case where the alignment accuracy is ±0.1 μm, for example, the width of the trench isolation layer 17 is set to approximately 0.2 μm.

Moreover, if the trenches 7 have the width larger than a dimension of the alignment accuracy of the emitter layers 5, the mask 152 for forming the emitter layers 5 can have the similar effect to the effect of absorbing the misalignment of the mask.

<Effects>

Figure 6:
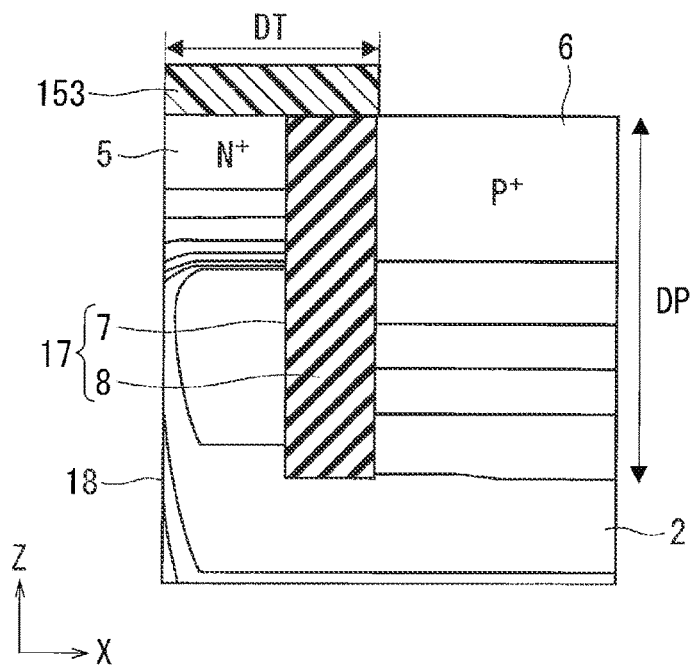
FIG. 6 is a cross-sectional view showing an impurity distribution of a region including a diffusion layer in the IGBT of the first preferred embodiment according to the present invention.

Next, FIG. 6 shows an example of the impurity distribution in a region "B" including the one emitter layer 5, the trench isolation layer 17 in contact with the emitter layer 5, and the diffusion layer 6 in contact with the trench isolation layer 17 in the IGBT 100 shown in FIG. 1.

FIG. 6 shows a concentration distribution in a case where the diffusion layer 6 is formed approximately twice as deep as the emitter layer 5, and the P-impurities are distributed in the range shown by an arrow DP in the diagram. Hereinafter, this is referred to as the deep $P^+$ diffusion layer. FIG. 6 shows the impurity concentration by isoconcentration lines. Among the regions surrounded by the plurality of isoconcentration lines, the region closer to the outermost surface of the base layer 2 has the higher concentration.

As shown in FIG. 6, the trench isolation layer 17 functions as a diffusion barrier against the P-type impurities, to thereby prevent the diffusion layer 6 from getting close to the channel region formed in the base layer 2 near the trench gate 18.

Here, FIG. 6 shows the state where the mask 153 used for forming the diffusion layer 6 is disposed. A distance DT from the trench gate 18 to the diffusion layer 6 is defined as a length of the mask 153 from the trench gate 18.

Figure 7:
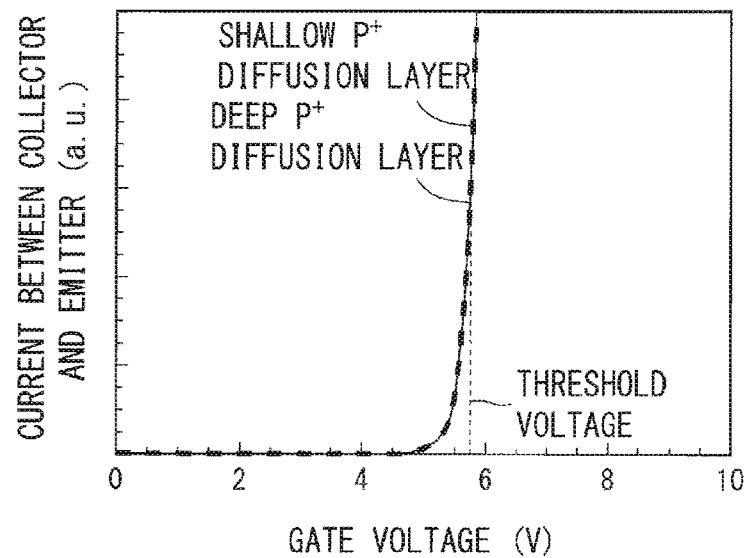
FIG. 7 is a diagram illustrating an electrical characteristic between a collector and an emitter upon application of a gate voltage.

FIG. 7 shows an electrical characteristic between a collector and an emitter upon application of a gate voltage in a case where the deep $P^+$ diffusion layer shown in FIG. 6 is provided and a case where the shallow $P^+$ diffusion layer described with reference to FIG. 21 is provided.

In FIG. 7, the horizontal axis represents the gate voltage (V) and the vertical axis represents the current between the collector and the emitter (a.u.). It is clear that the case where the deep $P^+$ diffusion layer is provided and the case where the shallow $P^+$ diffusion layer is provided have the same characteristic, and even if the diffusion layer 6 is formed deeper than the emitter layer 5, the threshold voltage is not changed.

The conceivable reason is that the trench isolation layer 17 prevents the diffusion layer 6 from getting close to the channel region, whereby the channel region does not affect the diffusion layer 6.

The diffusion layer 6 is formed deeper than the emitter layer 5 to reduce the resistance of the base layer 2, and the hole current built up in the device during turn-off is passed to the emitter layer 5 to prevent the parasitic thyristor from turning on. This can secure the high durability.

Figure 8:
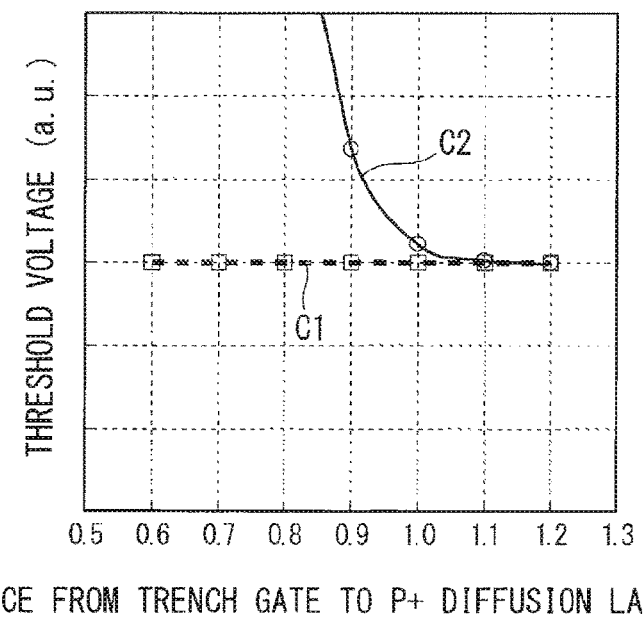
FIG. 8 is a diagram illustrating a dependence of a threshold voltage on a distance between a trench gate and a $P^+$ diffusion layer.

FIG. 8 is a diagram illustrating a dependence of the threshold voltage on a distance between the trench gate and the $P^+$ diffusion layer. In FIG. 8, the horizontal axis represents the distance (μm) from the trench gate to the $P^+$ diffusion layer, the vertical axis represents the threshold voltage (a.u.), the characteristic of the IGBT 90 shown in FIG. 23 represents a characteristic C2, and the characteristic of the IGBT 100 represents a characteristic C1.

As shown in FIG. 8, in the characteristic C2, if the distance from the trench gate to the $P^+$ diffusion layer is short, the threshold voltage increases, resulting in the great range of variation accompanied by a change in the distance. In contrast, if the distance from the trench gate to the $P^+$ diffusion layer increases to be approximately 1.2 μm, the threshold voltage decreases, so that the range of variation accompanied by the change in the distance decreases to be stable. In the characteristic C1, even if the distance between the diffusion layer 6 and the trench gate 18 is short or long, the threshold voltage is constant. The conceivable reason is that the trench isolation layer 17 serves as a diffusion barrier even in a case where the diffusion layer 6 is close to the trench gate 18.

Moreover, while the distance between the trench gate and the $P^+$ diffusion layer is needed to be approximately 1.2 μm to stabilize the threshold voltage in the characteristic C2, the distance of approximately 0.6 μm can stabilize the threshold voltage in the characteristic C1, whereby the distance between the trench gate and the $P^+$ diffusion layer can be greatly reduced.

Therefore, the distance between the trench gates can be reduced, so that increasing the number of trench gates allowed to be formed per unit area can efficiently increase the channel width and reduce the on-resistance.

The IGBT 100 can suppress the latch-up, and the reason will be described with reference to FIGS. 9 and 10.

FIGS. 9 and 10 show distributions of absolute values of hole current densities during turn-off in the case where the shallow $P^+$ diffusion layer described with reference to FIG. 21 is provided and the case where the deep $P^+$ diffusion layer described with reference to FIG. 6 is provided, respectively. FIGS. 9 and 10 show the absolute values of the hole current densities by isocurrent density lines, and among regions surrounded by the plurality of isocurrent density lines, the region having the highest hole current density is marked by the darkest hatch pattern, and as the hole current density decreases, the hatch pattern is also lighter. For the sake of brevity, three kinds of the hatching patterns are used.

As shown in FIG. 9, in a case where the shallow $P^+$ diffusion layer is provided, the hole current as shown by an arrow flows in the shallow $P^+$ diffusion layer by passing directly below the emitter layer 25. In contrast, as shown in FIG. 10, in a case where the trench isolation layer 17 and the deep $P^+$ diffusion layer are provided, the hole current as shown by an arrow flows in the deep $P^+$ diffusion layer without passing directly below the emitter layer 5. The conceivable reason is that the trench isolation layer 17 allows the region having the high hole current density to be formed in the region sandwiched between the trench isolation layers 17 to avoid being directly below the emitter layer 5.

Figure 11:
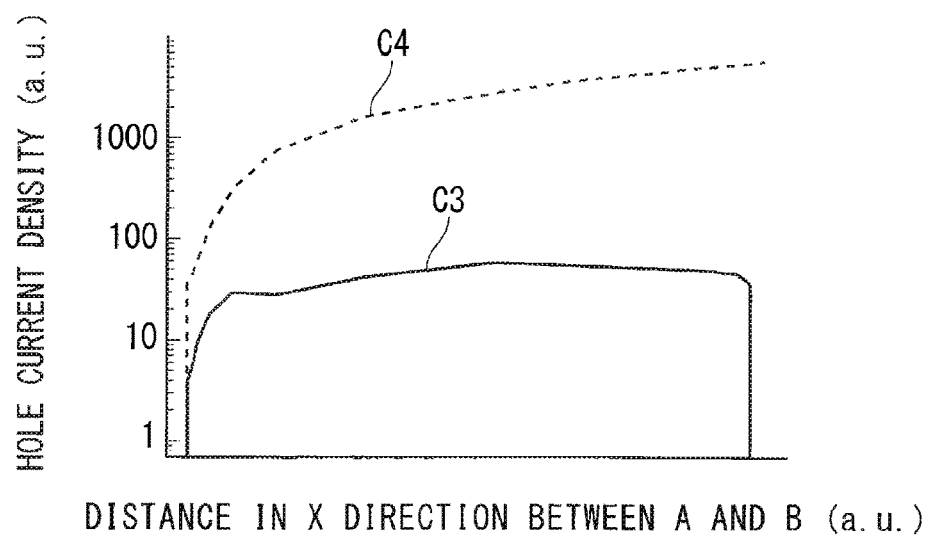
FIG. 11 is a diagram illustrating a dependence of an absolute value of a hole current density on a distance.

FIG. 11 shows a dependence of an absolute value of a hole current density in a portion between A and B on a distance between A and B shown in FIGS. 9 and 10. The horizontal axis represents the distance in the X direction between A and B (a.u.), and the vertical axis represents the absolute value of the hole current density (a.u.).

In FIG. 11, the dependence of the absolute value of the hole current density on the distance between A and B shown in FIG. 9 represents a characteristic C4, and the dependence of the hole current density of the absolute value on the distance between A and B shown in FIG. 10 represents a characteristic C3.

As seen from FIG. 11, in a case where the trench isolation layer 17 and the deep P+ diffusion layer are provided, the absolute value of the hole current density directly below the emitter layer is reduced to approximately 1/100 of the conventional configuration. Thus, the operation of the parasitic thyristor is suppressed, and the suppression of the latch-up can increase the durability.

As described above, in the IGBT 100 of the first preferred embodiment according to the present invention, the trench isolation layer 17 is provided so as to separate the emitter layer 5 and the diffusion layer 6, to thereby suppress the diffusion in the horizontal direction of the P-type impurities of the diffusion layer 6. Even if the distance between the trench gate and the P+ diffusion layer is short, the distance between the trench gates can be shorten without increasing the threshold voltage. The suppression of the latch-up can also increase the durability.

<First Modification>

In the IGBT 100 of the first preferred embodiment described above, the trench isolation layer 17 is configured such that the trench 7 extending in the base layer 2 in the thickness direction is filled with the insulating layer 8, but the trench 7 may be filled with a conductor.

Here, examples of the conductor include metals such as a polysilicon that is formed by the CVD method and has conductivity and an aluminum formed by the sputtering method.

In this configuration, the emitter electrode 12 can come into contact with the emitter layers 5 through the trench isolation layers 17 and can also come into contact with the diffusion layers 6 through the trench isolation layers 17. This can further reduce the contact resistance, whereby the durability can be increased.

Moreover, the silicon oxide films are formed so as to cover the inner surfaces of the trenches 7. Subsequently, the trenches 7 having the inner surfaces covered with the silicon oxide films may be filled with the polysilicon layers having conductivity.

The trench isolation layer 17 has the same configuration as that of the trench gate 18, which enables to simultaneously form the trench gates 18 and the trench isolation layers 17.

Here, the trenches 3 of the trench gates 18 and the trenches 7 of the trench isolation layers 17 have the different depths and also have the different widths of the openings. In other words, the width of the opening of the trench 7 is approximately one-third that of the trench 3. Thus, even in a case of performing the etching on the trenches 7 and the trenches 3 simultaneously, the trenches 7 are formed shallower than the trenches 3 due to a micro-loading effect, whereby the trenches 7 and the trenches 3 can be formed simultaneously.

Forming the trenches 7 and the trenches 3 simultaneously can reduce the numbers of masks and the cost of the process and also prevents the variation in the distance between the trench 3 and the trench 7. This can suppress the variation in the threshold voltage caused by the variation in the distance between the trench 3 and the trench 7.

<Second Modification>

In the IGBT 100 of the first preferred embodiment described above, $5\times10^{18}$ to $5\times10^{19}/cm^3$ is shown as an example of the impurity concentration of the diffusion layers 6, but it may be increased to $5\times10^{19}$ to $5\times10^{20}/cm^3$.

In the conventional configuration without the trench isolation layers, if the impurity concentration of the diffusion layers increases, the impurities are further diffused in a horizontal direction and get closer to the channel region, resulting in a stronger influence on the channel region. Thus, the diffusion layers are needed to be more separated from the trench gates, thereby imposing constraints on the increase in the impurity concentration of the diffusion layers.

However, in the configuration such as the IGBT 100 including the trench isolation layers 17, the trench isolation layers 17 can suppress the diffusion of the impurities in the horizontal direction, so that the impurity concentration of the diffusion layers 6 can be increased to the concentration which cannot be conventionally achieved. This can further reduce the contact resistance and further improve the durability.

<Third Modification>

In the IGBT 100 of the first preferred embodiment described above, $5\times10^{18}$ to $5\times10^{19}/cm^3$ is shown as an example of the impurity concentration of the emitter layers 5, but it may be increased to $5\times10^{19}$ to $5\times10^{20}/cm^3$.

In the conventional configuration without the trench isolation layers, if the impurity concentration of the emitter layers increases, the impurities are further diffused in a horizontal direction to affect the impurity distribution of the diffusion layers, and then the diffusion layers get close to the channel region, possibly resulting in a serious influence on the channel region.

However, in the configuration such as the IGBT 100 including the trench isolation layers 17, the trench isolation layers 17 can suppress the diffusion of the impurities in the horizontal direction, so that the impurity concentration of the emitter layers 5 can be increased to the concentration which cannot be conventionally achieved. This can further reduce the contact resistance and further improve the durability.

<Fourth Modification>

In the IGBT 100 of the first preferred embodiment described above, the trenches 7 are formed by etching the base layer 2 upon the formation of the trench isolation layers 17, and the trenches 7 are subsequently filled with the silicon oxide films by the CVD method, for example, to form the insulating layers 8, to thereby obtain the trench isolation layers 17. However, instead of forming the trenches 7, insulating isolation layers may be formed in the base layer 2 by implanting oxygen ions into the regions for forming the trenches 7.

Figure 12:
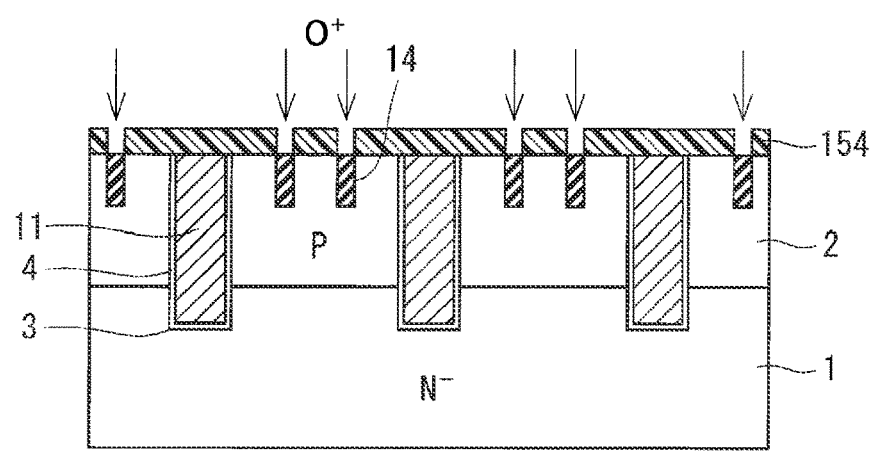
FIG. 12 is a cross-sectional view showing a step of forming insulating isolation layers in a modification of the first preferred embodiment according to the present invention.

FIG. 12 is a cross-sectional view showing a step of forming insulating isolation layers 14 by the method described above and is a diagram corresponding to the step described with reference to FIG. 3.

In the step shown in FIG. 12, a mask 154 having opening portions corresponding to positions for providing the insulating isolation layers 14 is patterned on the base layer 2, and the oxygen ions ($O^+$) are implanted with the mask 154 serving as an implantation mask to form the insulating isolation layers 14 having a depth of approximately 1.0 μm. The oxygen is ion-implanted into the base layer 2, and thus the regions implanted are oxidized to be silicon oxides, to thereby be insulating layers.

This method eliminates the need for the step of etching, filling an insulator, or the like, so that the easy process can form the insulating isolation layers and the cost of the process can be reduced.

<Second Preferred Embodiment>

In the IGBT 100 of the first preferred embodiment described above, all of the diffusion layers 6, the trench isolation layers 17, the emitter layers 5, and the trench gates 18 have the stripe shape in plan view and are extend in the Y direction as described with reference to FIG. 2. However, this is not restrictive, and a configuration as shown in FIG. 13 may be adopted.

Figure 13:
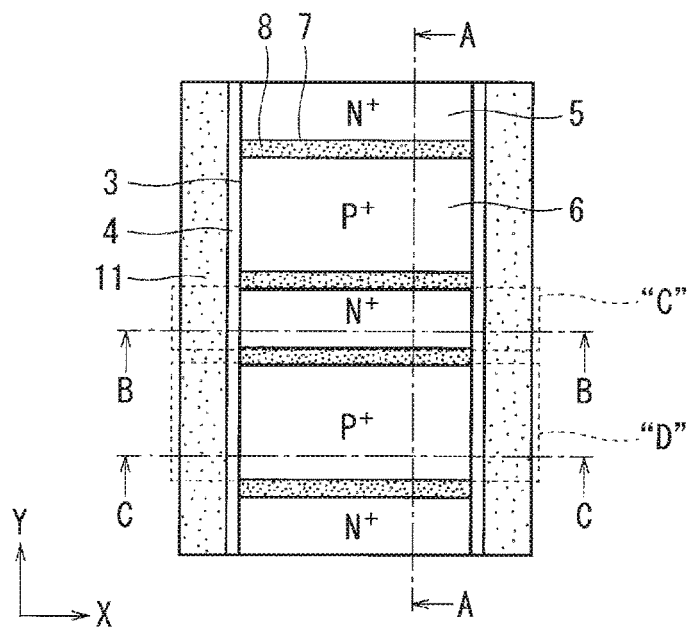
FIG. 13 is a partial plan view of an IGBT of a second preferred embodiment according to the present invention.

FIG. 13 is a plan view showing a configuration of an IGBT 200 of a second preferred embodiment according to the present invention. In the IGBT 200 shown in FIG. 13, metal oxide semiconductor (MOS) transistor cells defined as regions "C" and bipolar transistor cells defined as regions "D" are disposed alternately in an extending direction (Y direction) of trench gates 18 having a stripe shape. In other words, the regions of only emitter layers 5 and the regions of only diffusion layers 6 are disposed alternately in the extending direction (Y direction) of the trench gates 18 having the stripe shape.

The trench isolation layers 17 are provided between the MOS transistor cells and the bipolar transistor cells. The trench isolation layers 17 extend across the space between the trench gates 18 in a direction (X direction) orthogonal to the extending direction of the trench gates 18.

Figure 14:
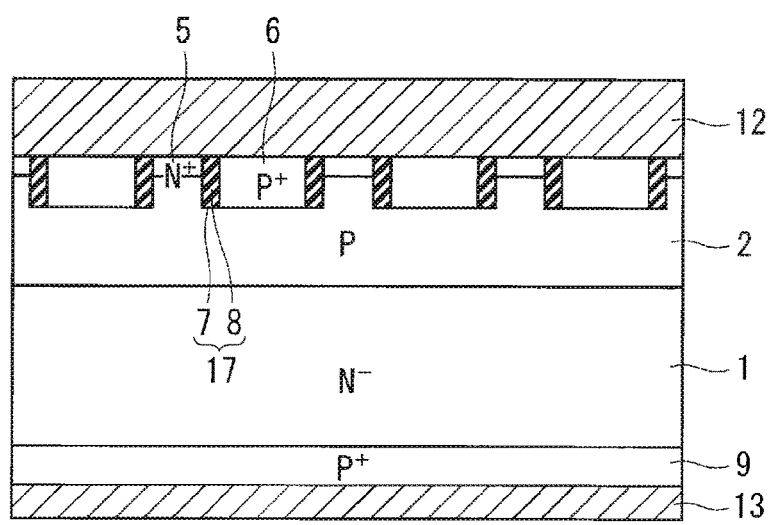
FIGS. 14 to 16 are cross-sectional views showing a configuration of the IGBT of the second preferred embodiment according to the present invention.
Figure 15:
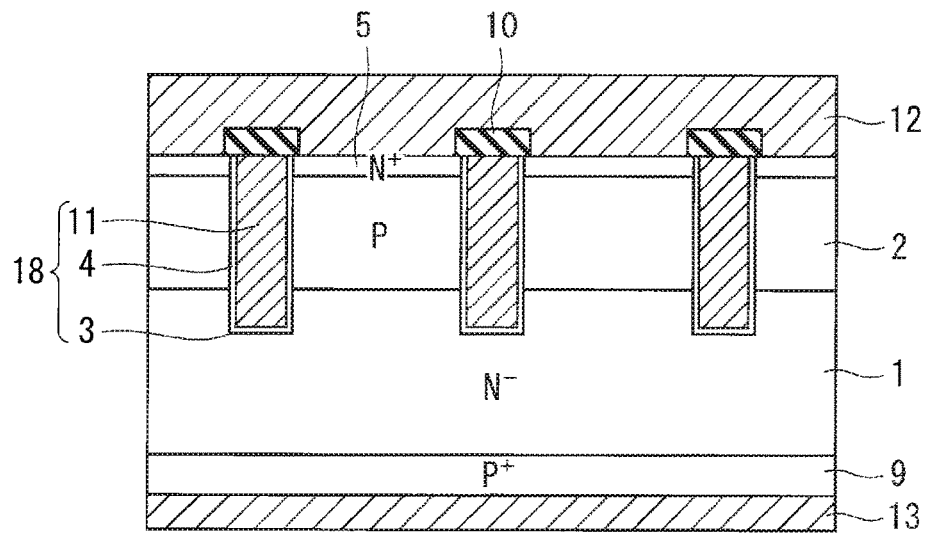
Figure 16:
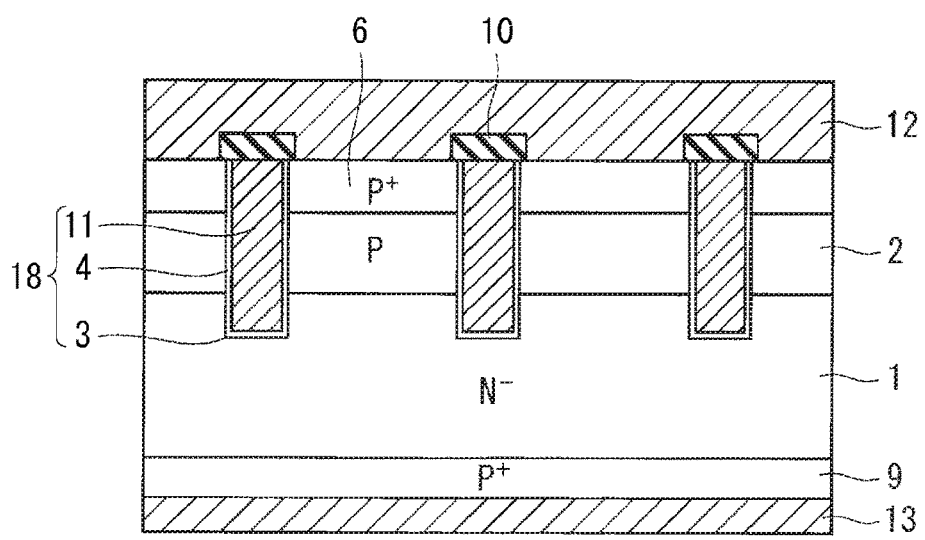

Here, FIG. 14 shows a cross-sectional view taken along an A-A line in FIG. 13, FIG. 15 shows a cross-sectional view taken along a B-B line in FIG. 13, and FIG. 16 shows a cross-sectional view taken along a C-C line in FIG. 13. In addition, in FIGS. 14 to 16, the same components as those of the IGBT 100 shown in FIG. 1 have the same reference numerals, and the redundant description will be omitted.

As shown in FIGS. 13 and 14, the area of the MOS transistor cell is formed smaller than that of the bipolar transistor cell. In other words, the area of the emitter layer 5 is formed smaller than that of the diffusion layer 6, but this is an example. The area of the MOS transistor cell may be greater than that of the bipolar transistor cell, and both areas may be the same.

In a case where the MOS transistor cells and the bipolar transistor cells are disposed alternately, the impurities in each of the diffusion layers 6 and the emitter layers 5 interfere with each other due to the mutual diffusion thereof, to thereby fluctuate the channel width of the channel region formed in the base layer 2 near the trench gate 18. In the IGBT 200 shown in FIG. 13, the trench isolation layers 17 are provided between the MOS transistor cells and the bipolar transistor cells, so that the function of the trench isolation layer 17 as the diffusion barrier can reduce the interference between the diffusion layers 6 and the emitter layers 5 and suppress the fluctuation of the channel width.

<Third Preferred Embodiment>

Figure 17:
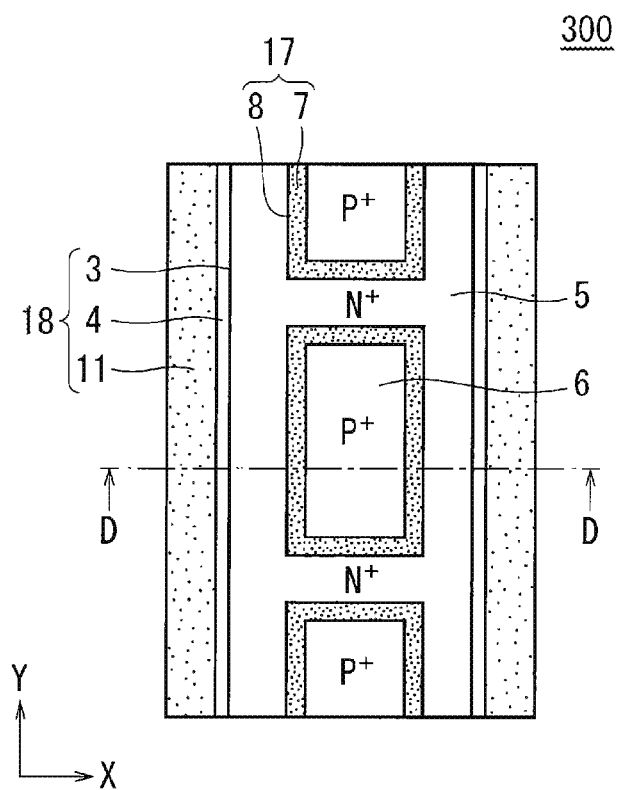
FIG. 17 is a partial plan view of an IGBT of a third preferred embodiment according to the present invention.

FIG. 17 is a cross-sectional view showing a configuration of an IGBT 300 of a third preferred embodiment according to the present invention. The IGBT 300 shown in FIG. 17 adopts a configuration in which a plurality of rectangular diffusion layers 6 are aligned in a line with intervals in the extending direction (Y direction) of trench gates 18 between the trench gates 18 having the stripe shape, trench isolation layers 17 being disposed so as to surround each of the diffusion layers 6. In addition, an emitter layer 5 is provided in a portion except for the diffusion layers 6 and the trench isolation layers 17 between the trench gates 18. The shape of the diffusion layers 6 is not limited to the rectangle and may be an ellipse, so that the shape of the trench isolation layers 17 may be determined on the basis of the shape of the diffusion layers 6.

Moreover, a cross-sectional shape taken along a D-D line in FIG. 17 is the same as the IGBT 100 shown in FIG. 1, and the IGBT 300 has the same effects as those of the IGBT 100. Since the diffusion layers 6 are aligned with the intervals, the IGBT 300 has an advantage over the IGBT 100 that the area of the emitter layer 5 can be increased.

<Fourth Preferred Embodiment>

Figure 18:
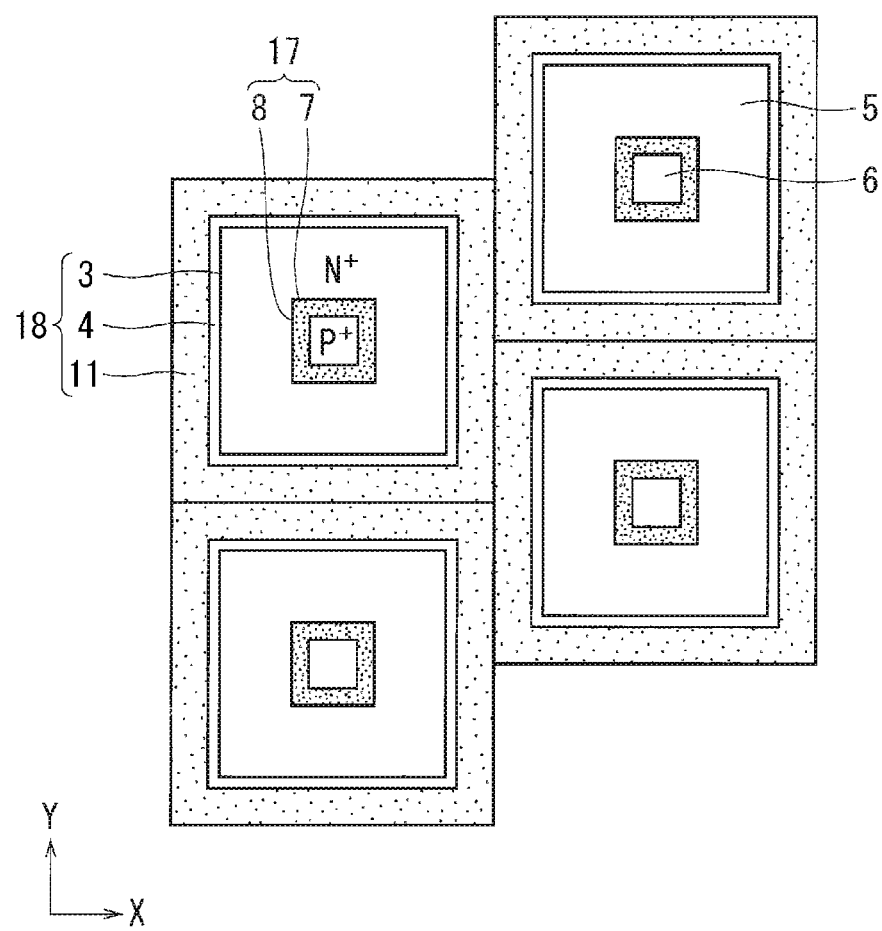
FIG. 18 is a partial plan view of an IGBT of a fourth preferred embodiment according to the present invention.

FIG. 18 is a plan view showing a configuration of an IGBT 400 of a fourth preferred embodiment according to the present invention. The IGBT 400 shown in FIG. 18 has a configuration in which a plurality of rectangular diffusion layers 6 are disposed with regular intervals in a surface of a base layer 2 (not shown), trench isolation layers 17 are disposed so as to surround each of the diffusion layers 6, emitter layers 5 are disposed to surround the trench isolation layers 17, and trench gates 18 are disposed so as to further surround outer peripheries of the emitter layers 5. The region surrounded by the trench gate 18 forms one IGBT cell. In the IGBT 400, the rectangular IGBT cells are disposed closely to one another, to thereby form a mesh pattern as a whole. In addition, the shape of the diffusion layers 6 in plan view is not limited to a rectangle and may be a polygon such as a hexagon, so that the shapes of the emitter layers 5 and the trench isolation layers 17 may be determined on the basis of the shape of the diffusion layers 6.

The IGBT 400 has the same effects as those of the IGBT 100. Since each of the IGBT cells is surrounded by the trench gate 18, the IGBT 400 has an advantage over the IGBT 100 that each of the IGBT cells is not easily affected by the other IGBT cells.

<Other Application>

In the first to fourth preferred embodiments described above, the examples in which the present invention is applied to the IGBT are shown. The present invention can also be applied to a metal oxide semiconductor field effect transistor (MOSFET), and the same effects can be obtained.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a first semiconductor layer of a second conductivity type disposed on one main surface of a semiconductor substrate of a first conductivity type;
   a plurality of trench gates penetrating said first semiconductor layer in a thickness direction to reach the inside of said semiconductor substrate;
   a second semiconductor layer of the second conductivity type selectively provided in an upper portion of said first semiconductor layer between said trench gates;
   an isolation layer that is in contact with a side surface of said second semiconductor layer and extends in said first semiconductor layer in the thickness direction;
   a third semiconductor layer of the first conductivity type that is provided in the upper portion of said first semiconductor layer between said trench gates and has at least one side surface in contact with said trench gate and at least one other side surface in contact with said isolation layer;

a first main electrode disposed on said first semiconductor layer so as to come into contact with said second semiconductor layer and said third semiconductor layer; and a second main electrode provided on the other main surface side opposite to said one main surface of said semiconductor substrate, wherein said isolation layer is provided between said second semiconductor layer and said third semiconductor layer to separate said second and third semiconductor layers from each other and is formed to extend to the same depth as that of said second semiconductor layer or to a position deeper than that of said second semiconductor layer, said second semiconductor layer comprises a bottom surface that is in contact with said first semiconductor layer, and a thickness of said isolation layer and said second semiconductor layer is at least twice that of said third semiconductor layer.

2. The semiconductor device according to claim 1, wherein said second semiconductor layer is formed deeper than said third semiconductor layer.

3. The semiconductor device according to claim 1, wherein said isolation layer includes:
a trench formed to extend in said first semiconductor layer in the thickness direction; and
an insulating layer filled in said trench, and said trench has a width larger than a dimension of an alignment accuracy upon formation of said second semiconductor layer and said third semiconductor layer.

4. The semiconductor device according to claim 1, wherein said isolation layer includes:
a trench formed to extend in said first semiconductor layer in the thickness direction; and
a conductor filled in said trench.

5. The semiconductor device according to claim 1, wherein said isolation layer includes:
a trench formed to extend in said first semiconductor layer in the thickness direction;
a silicon oxide film formed to cover an inner surface of said trench; and
a polysilicon layer that fills said trench and has conductivity.

6. The semiconductor device according to claim 1, wherein said second semiconductor layer has an impurity concentration of $5 \times 10^{19}$ to $5 \times 10^{20}/cm^3$.

7. The semiconductor device according to claim 1, wherein said third semiconductor layer has an impurity concentration of $5 \times 10^{19}$ to $5 \times 10^{20}/cm^3$.

8. The semiconductor device according to claim 1, wherein
said trench gates have a stripe shape in plan view and are disposed in a direction orthogonal to their extending direction,
said second semiconductor layer and said third semiconductor layer are provided alternately between said trench gates in the extending direction of said trench gates, and
said isolation layer is provided between said second semiconductor layer and said third semiconductor layer to extend between said trench gates.

9. The semiconductor device according to claim 1, wherein
said trench gates have a stripe shape in plan view and are disposed in a direction orthogonal to their extending direction,
a plurality of said second semiconductor layers are disposed with intervals in an extending direction of said trench gates between said trench gates,
said isolation layer is provided to surround each of said second semiconductor layers, and
said third semiconductor layer is provided in a portion between said trench gates except for said second semiconductor layers and said isolation layer.

10. The semiconductor device according to claim 1, wherein
a plurality of said second semiconductor layers are disposed with regular intervals in a surface of said first semiconductor layer,
said isolation layer is provided to surround each of said second semiconductor layers,
said third semiconductor layer is provided so as to surround said isolation layer,
said trench gates are provided to further surround an outer periphery of said third semiconductor layer, and
regions surrounded by said trench gates are disposed closely to each other.

11. A method for manufacturing the semiconductor device according to claim 1, wherein said isolation layer is formed before said second semiconductor layer is formed.

12. The method for manufacturing the semiconductor device according to claim 11, wherein
said isolation layer is formed by selectively ion-implanting oxygen into said first semiconductor layer.

13. The method for manufacturing the semiconductor device according to claim 11, wherein
each of said plurality of trench gates includes:
a first trench provided to penetrate said first semiconductor layer in a thickness direction to reach the inside of said semiconductor substrate;
a silicon oxide film formed to cover an inner surface of said first trench; and
a polysilicon layer that fills said first trench and has conductivity,
said isolation layer includes:
a second trench formed to extend in said first semiconductor layer in the thickness direction;
said silicon oxide film formed to cover an inner surface of said second trench; and
said polysilicon layer filled in said second trench, and
said trench gates and said isolation layer are simultaneously formed.

14. The semiconductor device according to claim 1, wherein
said first main electrode is an emitter electrode, and
said second main electrode is a collector electrode.

* * * * *